US007005898B2

(12) United States Patent
Tam et al.

(10) Patent No.: US 7,005,898 B2
(45) **Date of Patent: *Feb. 28, 2006**

(54) PROGRAMMABLE DIVIDER WITH BUILT-IN PROGRAMMABLE DELAY CHAIN FOR HIGH-SPEED/LOW POWER APPLICATION

(75) Inventors: Derek Tam, Irvine, CA (US); Takayuki Hayashi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/946,172

(22) Filed: Sep. 22, 2004

(65) Prior Publication Data

US 2005/0035794 A1 Feb. 17, 2005

Related U.S. Application Data

(60) Continuation of application No. 10/683,262, filed on Oct. 14, 2003, now Pat. No. 6,882,189, which is a division of application No. 10/314,954, filed on Dec. 10, 2002, now Pat. No. 6,661,261, which is a continuation of application No. 09/969,135, filed on Oct. 3, 2001, now Pat. No. 6,518,805.

(60) Provisional application No. 60/237,529, filed on Oct. 4, 2000.

(51) Int. Cl.
*H03K 21/00* (2006.01)

(52) U.S. Cl. ....................... 327/115; 327/117; 327/176; 377/47; 377/48

(58) Field of Classification Search ................ 327/113, 327/115, 117, 120, 121, 173–176; 377/47, 377/48, 113

See application file for complete search history.

(56) References Cited

U.S. PATENT DOCUMENTS

| | | | | |
|---|---|---|---|---|
| 4,546,487 | A | 10/1985 | Dackow | 377/51 |
| 5,381,453 | A | 1/1995 | Chan | 377/28 |
| 5,390,223 | A | 2/1995 | Lindholm | 377/49 |
| 5,425,074 | A | 6/1995 | Wong | 377/47 |
| 5,561,674 | A | 10/1996 | Cho | 377/55 |
| 5,748,949 | A | 5/1998 | Johnston | 395/557 |
| 5,859,890 | A | 1/1999 | Shurboff et al. | 377/48 |
| 5,946,369 | A | 8/1999 | Kolagotla et al. | 377/47 |
| 6,097,783 | A | 8/2000 | Monk | 377/47 |
| 6,115,442 | A | 9/2000 | Lusinchi | 377/47 |
| 6,518,805 | B1 | 2/2003 | Tam et al. | 327/115 |

FOREIGN PATENT DOCUMENTS

EP 0 926 834 A1 6/1999

*Primary Examiner*—Timothy P. Callahan
*Assistant Examiner*—An T. Luu
(74) *Attorney, Agent, or Firm*—Sterne, Kessler, Goldstein & Fox PLLC

(57) ABSTRACT

A programmable divider includes a synchronous counter configured to process an input clock signal and produce first output signals in response the input clock signal. A number of logic devices are coupled to the synchronous counter and configurable to receive the first output signals and correspondingly produce second output signals. Also included is a multiplexer that is configured to receive the second output signals and has an output coupled to an input of the synchronous counter. In the programmable divider, characteristics of the synchronous counter are selectable based upon a particular number of the logic devices configured.

3 Claims, 6 Drawing Sheets

PROGRAMMABLE DIVIDER WITH BUILT-IN PROGRAMMABLE DELAY CHAIN FOR HIGH-SPEED/LOW POWER APPLICATION

CROSS-REFERENCE TO RELATED APPLICATIONS

This application is a continuation of U.S. Non-Provisional Application entitled "A Programmable Divider with Built-In Programmable Delay Chain for High-Speed/Low Power Application," Ser. No. 10/683,262, filed Oct. 14, 2003, now has become U.S. Pat. No. 6,882,189, which is a divisional of the U.S. Non-Provisional Application Ser. No. 10/314,954, filed Dec. 10, 2002, now become U.S. Pat. No. 6,661,261, which is a continuation of U.S. Non-Provisional application Ser. No. 09/969,135, filed Oct. 3, 2001, now has become U.S. Pat. No. 6,518,805, which claims the benefit of U.S. Provisional Application No. 60/237,529, filed Oct. 4, 2000, all of which are incorporated herein in their entireties by reference.

BACKGROUND OF THE INVENTION

1. Field of the Invention

The present invention generally relates to divide-by-N circuits for dividing the frequency of a master clock signal in order to obtain a clock signal having a different frequency from that of the master clock signal. The present invention more particularly relates to a high-speed programmable divider capable of providing an output clock signal having an increased duty cycle and a programmable delay chain.

2. Background Art

Divider circuits are well-known circuits that are used to divide the frequency of a clock signal (e.g., a system clock) by a specific number of counts. That is, for N clock pulses input into the circuit, only one output pulse is generated.

These divider circuits are used for a number of different applications. In particular, divider circuits are used to reduce the overall number of oscillators required on a given semiconductor chip, thereby making available additional room on the chip to place as much other circuitry as possible. Variable control oscillators (VCOs), for example, are commonly used in phase lock loop (PLL) circuits. Often, a single VCO circuit is provided that generates a master clock signal. One or more divider circuits may then be used to generate clock signals having different frequencies.

Typically, one or more divide-by-2 circuits are used to divide the master clock signal frequency by a factor of 2, 4, 8, etc. More particularly, most conventional divider circuits divide the master clock signal frequency by a divide ratio that is a power of 2. These conventional divider circuits normally comprise a number of D flip flops, which may be configured for use in a divider circuit by tying the Q bar to D. One D flip flop configured in this manner equates to divide by 2. Two flip flops equates to divide by 4, and three flip flops equates to divide by 8, and so on.

On the other hand, other types of divider circuits may be easily configured to accommodate any single divide ratio, regardless of whether the particular ratio is a power of 2 or not. The Johnson counter is one such device and may be configured to accommodate any divide ratio (e.g., 2, 3, 4, 5, or 6). For this reasons, Johnson counters are often among the most commonly used counters in divider circuits.

One problem with divider circuits using conventional counters, such as the Johnson counter, is that each circuit must be configured in accordance with only one divide ratio. That is, a particular divider circuit may only be configured to accommodate a divide ratio of 2, 3, or 4, etc., and not 2, 3, and 4. Further, although the Johnson counter is desirably because of its ability to accommodate any single divide ratio, it produces signal having undesirable duty cycles. For example, most modern PLLs, as well as other high-speed application, require clock signals having duty cycles on the order of about 50%. Typical Johnson counters, however, produce signals having much higher duty cycles.

What is needed, therefore, is a divider circuit reconfigurable to accommodate a variety of different frequency divide ratios. In addition, it would be desirable to have such a divider circuit that produces an output signal having a duty cycle suitable for high-speed applications, preferably on the order of about 50%. Further still, it would be desirable to have a divider circuit capable of selectively delaying the output clock signal to resolve timing issues.

BRIEF SUMMARY OF THE INVENTION

According to an aspect of the invention, a programmable divider circuit is provided that divides a master clock frequency by a factor to provide an output clock signal whose frequency is equal to the frequency of the master clock signal divided by that factor.

Consistent with the principles of the present invention as embodied and broadly described herein, the invention includes a programmable divider comprising a synchronous counter. The synchronous counter is configured to receive input clock signals and produce output signals responsive thereto. The programmable divider also comprises a control circuit coupled to the synchronous counter to form a feedback loop therewith. The control circuit is configurable to (i) selectively receive selected ones of the output signals and (ii) control divide characteristics associated with the synchronous counter based upon the selected output signals.

In another embodiment, the invention is directed to a method to control a divide ratio of a divider circuit. The method comprises receiving in a synchronous counter a first clock input signal and a first data signal, the first data signal being produced as an output from a first type logic gate. The receiving produces respective synchronous counter output signals. The method also comprises providing the respective synchronous counter output signals to selected inputs of N number of second type logic gates, wherein other inputs of the second type logic gates form N number of clock output ports. Each second type logic gate provides an intermediate signal as an output. One of the inputs of a first of the second type logic gates (i) is coupled to a first input of the first type logic gate and (ii) forms a first of the N number of clock output ports. Next, the method comprises respectively providing the N number of intermediate signals to N number of multiplexer inputs.

The multiplexer (i) produces multiplexer output signals based upon selected ones of the N number of inputs, (ii) supplies multiplexer output signals to a second input of the first type logic gate in accordance with the selected ones of the multiplexer inputs, and (iii) produces clock output signals at selected ones of the N number of clock output ports based upon the supplied multiplexer output signals. Finally, included is providing a control signal to a control signal port of the multiplexer to determine the selected ones of the N number of multiplexer inputs.

Features and advantages of the invention include providing a user with the capability to program a single divider circuit to accommodate a variety of different divide ratios.

Such a capability may be particularly useful in dynamic high-speed applications which call for different divide ratios throughout different aspects of the application. On such application may be a PLL configured to run at different speeds within a given circuit. These applications typically require dedicated divider circuits having predetermined divide ratios, which may lead to increased device production costs. Further, the additional circuit components may contribute to higher system failure rates.

Furthermore, the ability to convert the duty cycle of output signals to duty cycle values more suitable for higher speed applications expands the utility of conventional Johnson counters. This increased capability, realized through implementation of preferred embodiments of the present invention, eliminates the need to waste limited circuit board real estate to accommodate other circuit components specifically dedicated to performing this task.

BRIEF DESCRIPTION OF THE DRAWINGS/FIGURES

The accompanying drawings, which are incorporated in and constitute a part of the specification, illustrate an embodiment of the invention and, together with the description, explain the purpose, advantages, and principles of the invention. In the drawings.

DETAILED DESCRIPTION OF THE INVENTION

The following detailed description of the present invention refers to the accompanying drawings that illustrate exemplary embodiments consistent with this invention. Other inventions are possible, and modifications may be made to the embodiments from the spirit and scope of the invention. Therefore, the following detailed description is not meant to limit the invention. Rather, the scope of the invention is defined by the appended claims.

It would be apparent to one of skill in the art that the present invention, as described below, may be implemented in many different embodiments of hardware, software, firmware, and/or the entities illustrated in the figures. Any actual software code with specialized controlled hardware to implement the present invention is not limiting of the present invention. Thus, the operation and behavior of the present invention will be described with the understanding that modifications and variations of the embodiments are possible, given the level of detail presented herein.

Figure 1:
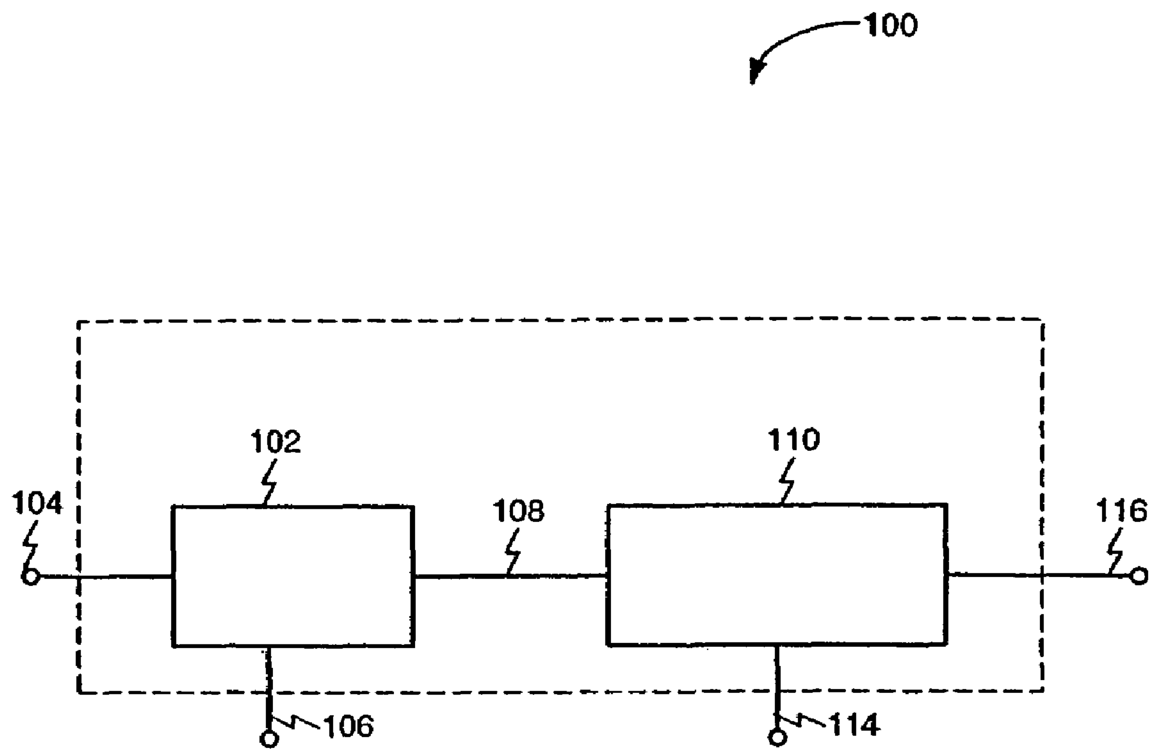
FIG. 1 is a block diagram depicting one illustrative embodiment of the invention.

Referring now to the figures, FIG. 1 illustrates a block diagram of an exemplary embodiment of the present invention. In FIG. 1, a programmable divider circuit 100 is provided and includes a programmable counter circuit 102, including an input port 104 and a control signal port 106. In a preferred embodiment of the present invention, the programmable counter circuit 102 is a modified Johnson's counter. However, it will be readily understood by those skilled in the art that other counter circuits may be used. Connection lines 108 provide a coupling mechanism between the programmable counter 102 and a duty-cycle adjustment/delay module 110.

Figure 2:
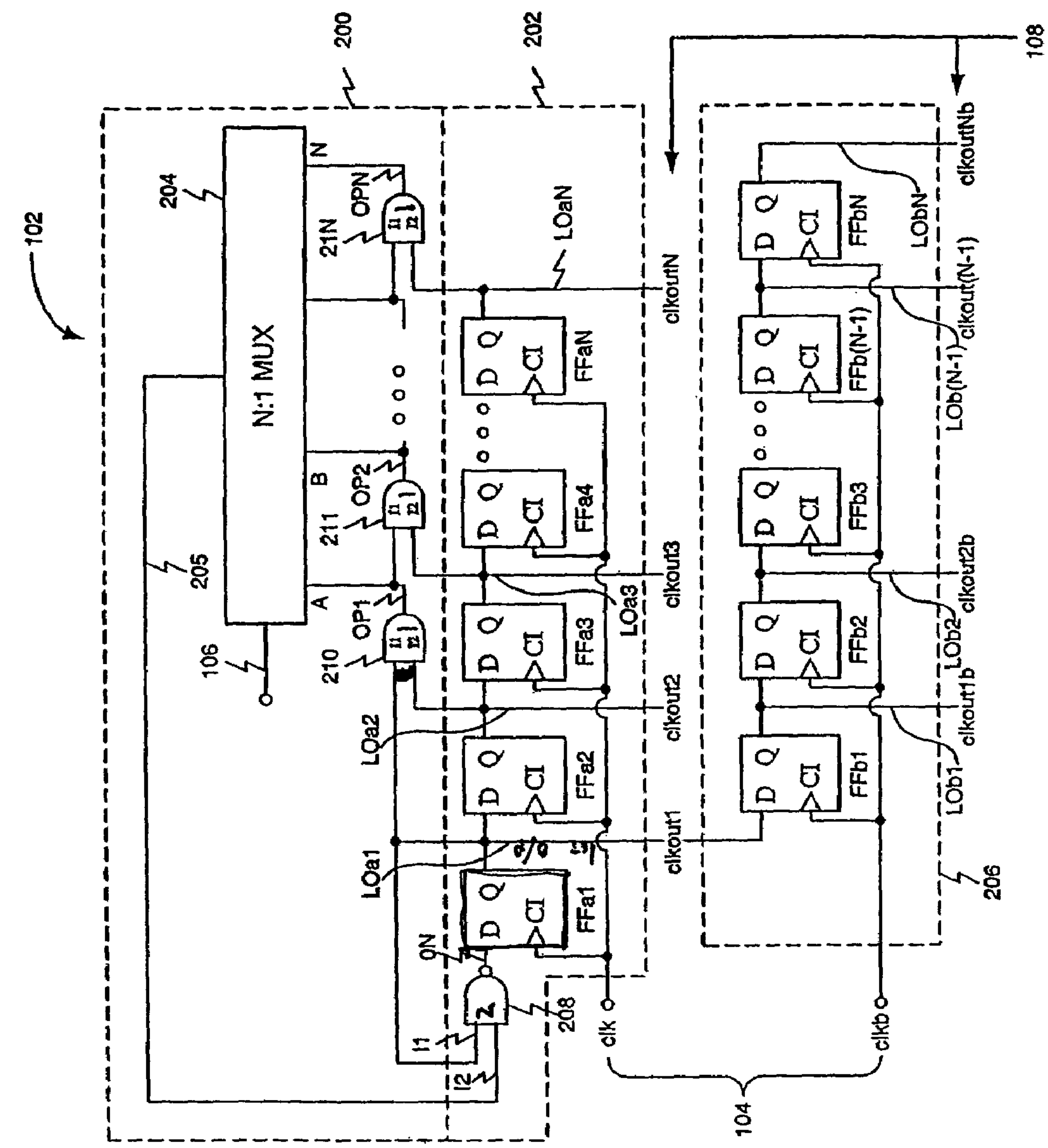
FIG. 2 is a schematic diagram of a programmable divider shown in the illustrative embodiment shown in FIG. 1.

The adjustment/delay module 110 includes a delay control port 114 and an output port 116. The programmable divider circuit 102 provides the capability to divide an input clock signal by a predetermined divide ratio and facilitate programmability for changing the divide ratio to any desirable value. This process will be described in greater detail below. The duty-cycle adjustment/delay module 110, on the other hand, provides the ability to adjust the duty-cycle of a clock signal produced by the programmable divider circuit 102. The duty-cycle adjustment/delay module 110 also provides the ability to program timing delays into successive output signals of the programmable divider circuit 102. FIG. 2 shows the programmable counter 102 in greater detail.

In FIG. 2, the programmable counter 102 includes a control circuit 200 and a synchronous counter 202. The control circuit 200 facilitates programming of the programmable counter 102, as discussed above. The control circuit 200 includes an N:1 multiplexer 204 and a number of logic gates LG1–LGN. The logic gates LG1–LGN each includes input ports I1 and I2 and respective output ports OP1–OPN. As shown in the figure, the outputs OP1–OPN are coupled to respective multiplexer inputs A–N. The multiplexer 204 includes an output port 206 which also provides a connection between the control circuit 200 and the synchronous counter 202.

The synchronous counter 202 includes a logic gate 208, and bi-stable devices FFa1–FFaN. In the present exemplary embodiment, the bi-stable devices are D flip flops and are series connected. However, it will be understood by those skilled in the art that other bi-stable devices and/or other type flip flops may be used instead. Further, in a preferred embodiment of the present invention the logic gates LG1–LGN, are AND gates and the logic gate 208 is a NAND gate, although other type logic gates may be chosen. The logic gate 208 includes inputs I1 and I2 and an output ON. As shown, the output ON is coupled to a data input D of a first flip-flop FFa1. The input port I1 of the NAND gate 208 is coupled to the input port I1 of the AND gate LG1. The input I1 of the NAND gate 208 and the input port I1 of the AND gate LG1 also form a first circuit line output LOa1 for providing an output clock signal CLKOUT1. Similarly, the input port I2 of the AND gates LG1–LGN form respective line outputs LOa2–LOaN, to provide as outputs respective clock signals CLKOUT2–CLKOUTN. Additional details regarding the clock signals are provided below. Furthermore, the output ports OP1 and OP2 of LG1 and LG2, are respectively connected to the input port I1 of LG2 and I1 of LGN. Each of the inputs I2 of LG1–LGN are also coupled to output ports Q of flip-flops FFa2–FFaN. Finally, the output port 206 of the multiplexer 204 is connected to the input port I2 of the NAND gate 208, thus providing a feedback loop between the outputs Q of the flip-flops FFa1–FFaN and the NAND gate 208.

As stated above, the multiplexer 204 provides programmability specifically, the multiplexer 204 controls the number of flip-flops to be included in the feedback path thus ultimately controlling the divide ratio of the divider circuit 102. For example, a divisor of 3 or 4 can be obtained by choosing the inputs A or B of the multiplexer 204 as the return path to the NAND gate, respectively. That is, a user may control whether the divider circuit 102 will be a divide-by-3 or a divide-by-4 by choosing between the inputs A or B. To activate this feature, the user, either through software or hardware, may provide an appropriate input control signal at the input port 106 of the multiplexer 204. The control signal of AND gates LG1–LGN permits selection and thus controls the device ratio of the divider circuit. The control signal controls this process by enabling the respective input ports of the multiplexer 204.

The flip-flops FFa1 through FFaN of the synchronous counter 202 are constructed and arranged to receive an input clock signal CLK at each of their respective input ports CI. As understood in the art, the idea of the synchronous counter 202 is to ripple a zero value level signal through the flip-flops FFa1 through FFaN within a certain number of clock cycles of the input clock signal CLK. The longer the chain, the more time it takes the zero to reach the end, the greater the divisor of the divide ratio. Next, an additional group of bi-stable devices 206 is included to provide the ability to adjust an output duty-cycle of output clock signals. The second group of bi-stable devices 206 is provided to produce complementary clock signal pulses in order to provide duty-cycle correction to the clock signals CLKOUT1–CLKOUTN in response to an input clock signal CLKb.

In a preferred embodiment of the present invention, the bi-stable devices 206 are also D type flip-flops and include flip-flop devices FFb1–FFbN. The devices 206, as in the case above, are also series-connected and configured to receive an input clock signal CLKb. The first flip-flop in the chain, FFb1, includes an input D coupled to the input ports I1 of NAND gate 208 and AND gate LG1 through the line output LOa1. The input D of the flip-flop FFb1 is also coupled to the output Q of the flip-flop FFa1 and the input D of the flip flop FFa2. Flip flop line outputs LOb2–LobN respectively connected to the output ports Q of the flip-flops FFb1–FFbN. Also, the line outputs LOb1–LOB(N−1) are also connected to the input ports D of respective the flip-flops FFb2 through FFbN and provide respective clock signals CLKOUT1*b*–CLKOUTNb as outputs.

Figure 3:
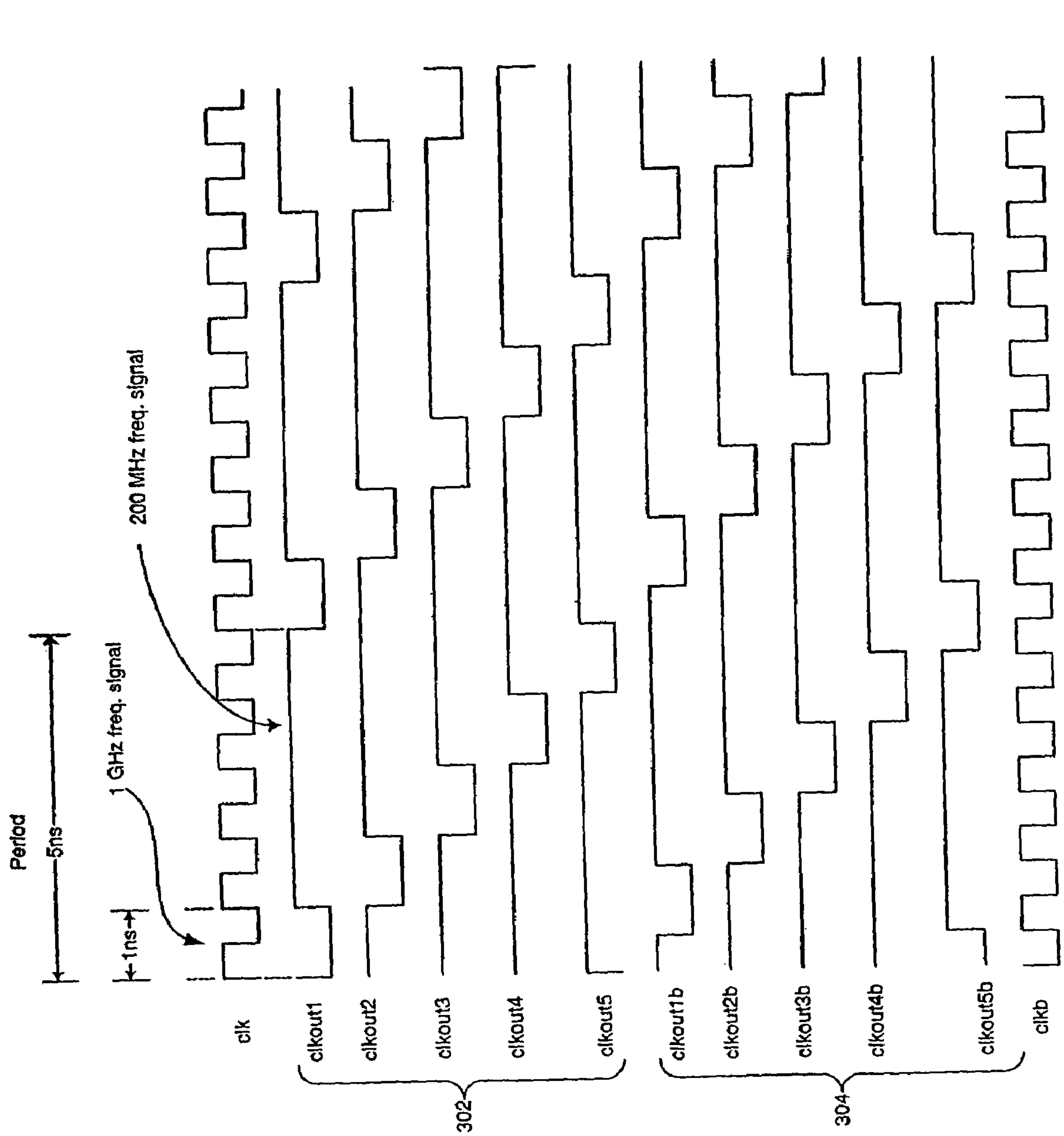
FIG. 3 is a timing diagram of exemplary timing signals associated with the programmable divider shown in FIG. 2.

FIG. 3 illustrates exemplary clock signals associated with a preferred embodiment of the present invention. One aspect of the invention facilitates the programmability of the divide ratio of the divider circuit 102. As stated above, the purpose of such a divider circuit is to divide the frequency of an input clock signal by a specific number of counts. That is, for N clock pulses input into the circuit, only one pulse is generated. One aspect of the invention facilitates programmability of the divide feature. In the present embodiment, a user, depending upon the application of the appropriate control signal at the input port 106, may select a divide ratio of 2, 3, 4, or any suitable number. For purposes of illustration, clock signals associated with a divide-by-5 circuit are shown in FIG. 3.

In FIG. 3, the exemplary clock signal CLK has a frequency of 1 gigahertz (GHz), which translates to a signal period of 1 nanosecond (ns) as shown. When provided as the input signal to the input ports CI of the flip-flops FFa1 through FFaN, the input clock signal CLK, in the case of a divide-by-5 frequency divider circuit, produces output clock signals CLKOUT1 through CLKOUT5. As illustrated in FIG. 3, each of the clock signals CLKOUT1–CLKOUT5 has a period of 5 ns, which includes 1 ns at a signal low level and 4 ns at a signal high level. Thus, as readily observed from FIG. 3, the input clock signal CLK, having a frequency of 1 GHz, produces output clock signals 302, which includes CLKOUT1–CLKOUT5, each at 200 MHz (i.e., ⅕ of 1 GHz). Similarly, a clock signal CLKb, which is substantially inversely related to the clock signal CLK. The input clock signal CLKb process a group output clock signal 304, including individual signals CLKOUT1*b*–CLKOUT5*b*. As in the case of the clock signal CLK, the clock signal CLKb also has a frequency of 1 gHz, and when provided as an input to the second group of devices 206, correspondingly produces the clock signals CLKOUT1*b*–CLKOUT5*b*, each having a frequency of 2 MHz.

Figure 4:
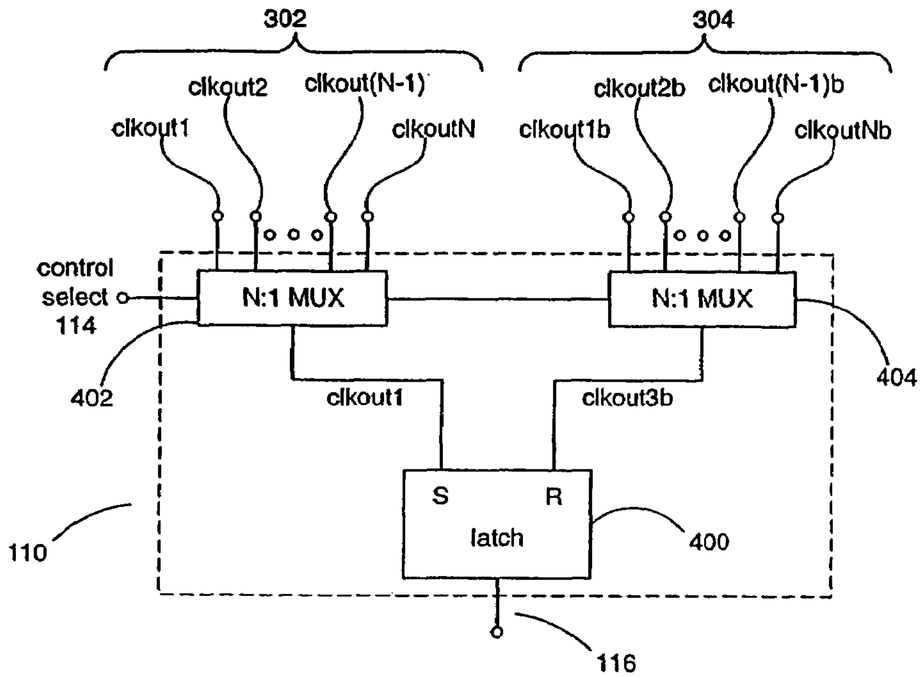
FIG. 4 is a block diagram of the duty cycle adjustment module of the illustrative embodiment FIG. 1.

As stated above, particular types of counters such as the Johnson counter used in the present exemplary embodiment, produce output signals having unacceptable duty cycles for high-speed applications. In many high-speed applications, such as PLL circuits used in digital communications systems, clock signals having duty cycles on the order of 50% are desirable. Thus, a need arises to convert the output clock signals CLKOUT1–CLKOUTN, to signals having duty cycles of about 50%. For purposes of the present application, a signal's duty cycle is a measure of its on-time (i.e., its pulse width) divided by the total signal period. Using this analogy, each of the output signals CLKOUT1–CLKOUT5 and the signals 304, shown in FIG. 3, exhibits a duty cycle of about 80%, which is unacceptable for use in high-speed applications discussed above. FIG. 4 illustrates a more detailed view of the duty cycle adjustment programmable delay module 110 shown in the exemplary embodiment of FIG. 1, provided to adjust the duty cycle of output signals.

In FIG. 4, the exemplary divider circuit 110 includes a latch 400 and two additional N:1 multiplexers 402 and 404. The latch 400 is used to combine outputs from the multiplexers 402 and 404 and produce an output based on inherent combining characteristics of the latch 400. Traditional latches include at least two different categories: positive-edge sensitive and negative-edge sensitive. In the present exemplary embodiment, the latch 400 is negative-edge sensitive, although the present invention is not specifically limited to such a configuration. As such, the latch 400 produces an output which changes based upon a negative edge of pulses received at input ports S and R. More specifically, the latch 400 is known in the art as an SR latch and includes the output port 116. The control select port 114 of the multiplexer 402 facilitates the ability to delay the timing between successive output signals provides to the output 116. Outputs of the multiplexers 402 and 404 are respectively coupled to the inputs R and S of the latch 400. As shown, the multiplexer 402 is configured to receive the signals 302 output from the Johnson counter 202, while the multiplexer 404 is configured to receive the output signals 304 output from the devices 206. As in the case of the multiplexer 204, the multiplexers 402 and 404 are provided in order to combine selected combinations of output signals 302 and 304 as inputs to the S/R latch 400. The operation of the duty-cycle adjustment programmable delay module 110 will now be discussed in greater detail.

Figure 5:
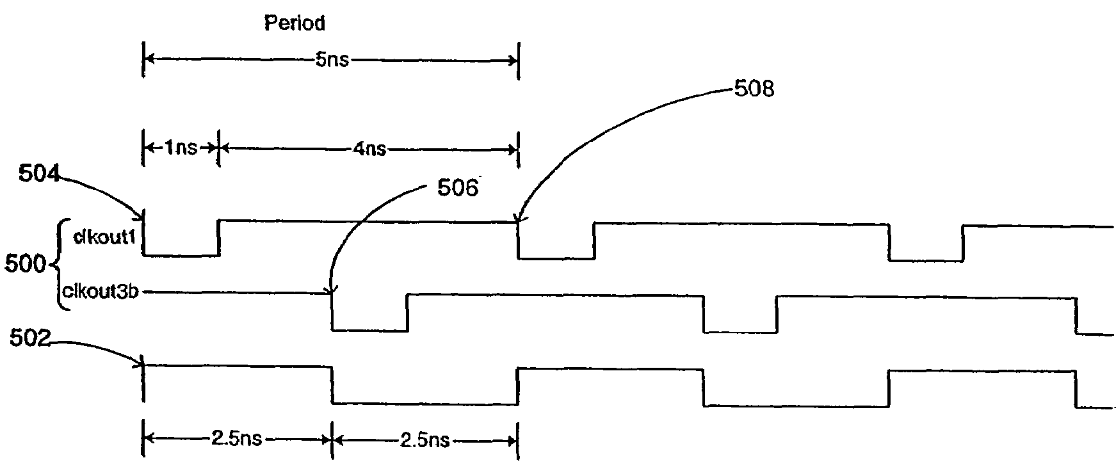
FIG. 5 is a timing diagram of exemplary timing signals produced by the duty cycle adjustment/delay module of FIG. 4.

FIG. 5 illustrates exemplary input clock signals 500, which include the signals CLKOUT1 and CLKOUT3 and an output clock signal 502. The inventors of the present invention have discovered that by hatching selected clock signals, produced from input clock signal CLK, with selected output clock signals produced by input clock signal CLKB, that are PHASE ???? an output signal having a predetermines duty cycle can be produced. More specifically, the present invention combines two signals together, each having a duty cycle of 80%. In the case of the exemplary divide-by-5 circuit of FIG. 2, any two of the output signals selected from signals 302 and 304 and having a phase relationship of about 50%, will produce an output signal at the output port 116 having a resulting duty cycle of about 50%.

In the exemplary embodiment of FIG. 4, the output signals CLKOUT1 and CLKOUT3*b* were chosen for purposes of illustration. Although each of the signals CLKOUT1 and CLKOUT3*b* has a frequency of about 200 MHz and a period of about 5 ns, these signals are separated in phase by about 50%. During operation, the signals CLKOUT1 and CLKOUT3*b* are both received as inputs to the latch 400. At a negative edge 504 of the output signal CLKOUT1, the latch 400 provides the output signal 502 at the output port 116. Since the S/R latch 400 is negative-edge sensitive, the output signal 502 became high when the latch 400 sensed the negative edge 504 of the signal CLKOUT1. The signal 502 remains high until the latch 400 senses a negative edge 506 of the clock signal CLKOUT3*b*. Upon sensing the negative edge 506, the clock signal 502 goes low and remains low until the latch 400 senses another negative edge 508 of the clock signal CLKOUT1. The latch 400 beginning to repeat this process when it senses the other negative edge 508, thereby ultimately producing the entire signal 502 having a duty cycle of about 50%. As stated above, any two signals from signal the 302 and 304 respectively selected by the multiplexers 402 and 404 and combined in the latch 400, will produce an output signal having a predetermined duty cycle. The selection process may be controlled by entering an appropriate control signal at the control-select input port 114. Although the present exemplary embodiment was illustrated based upon the example of a divide-by-5 circuit, the programmability of the present invention can accommodate divider circuits having any divide ratio.

A further advantage of the present invention is its ability to delay the timing between successive output signals. That is, in certain carefully synchronized applications, it may be necessary to provide additional setup time for subsequent applications, thus requiring a delay in corresponding clock output timing signals. In this respect, the inventors of the present application have discovered that by more carefully controlling the input signal selection of the multiplexers 402 and 404 programmed delays between successive output signals, produced by the latch 400, can be precisely determined.

Figure 6:
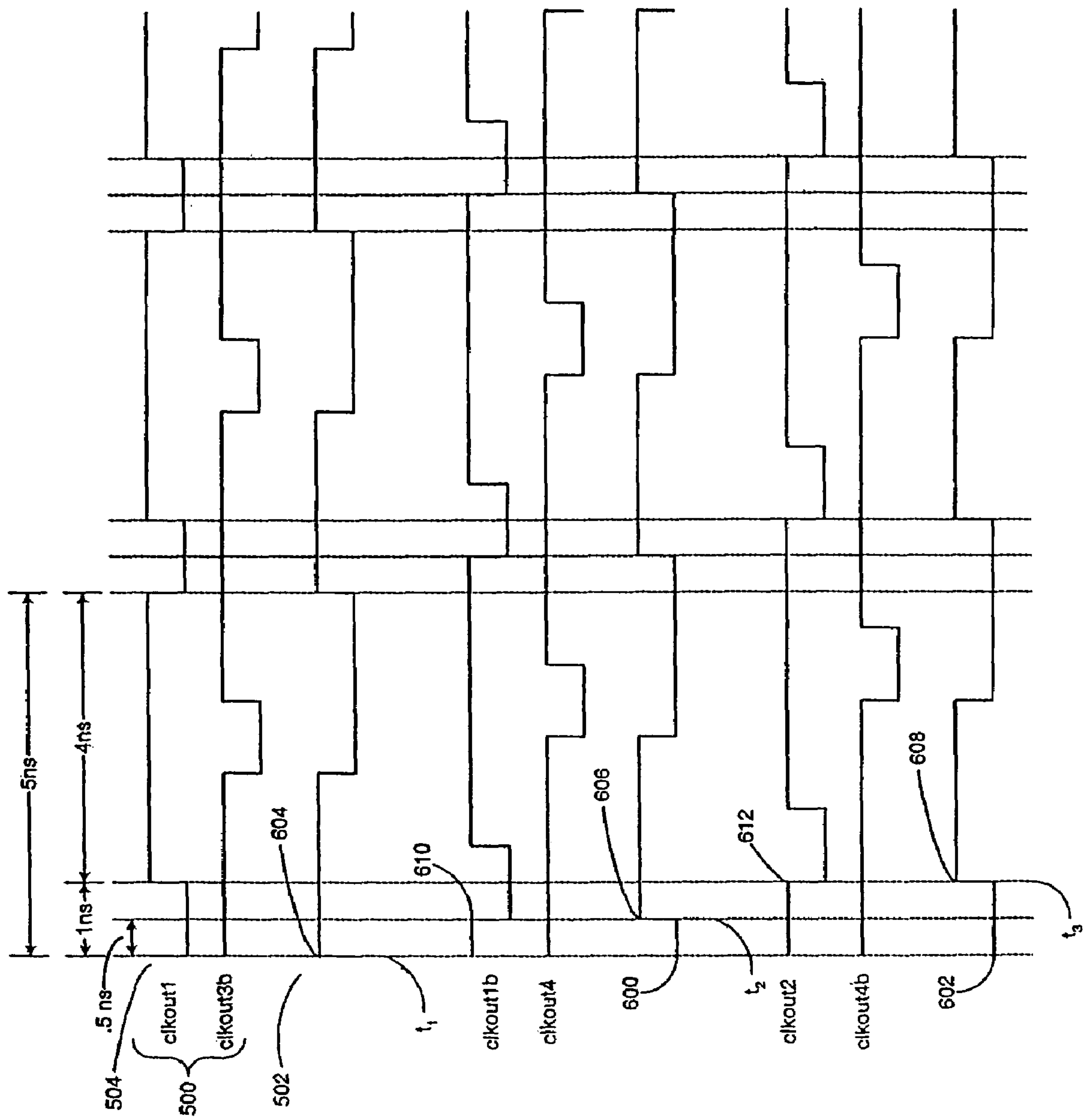
FIG. 6 is a timing diagram of exemplary timing signals produced by the duty cycle adjustment/delay module of FIG. 4 having programmed delays.

FIG. 6 depicts an exemplary timing relationship between successive output signals produced by combining predetermined input signals in the manner discussed above. More specifically, successive output signals 600 and 602, which succeed the signal 502 in time, are shown to be delayed with regard to a timing associated with the output signal 502. That is, each of the signals 502, 600 and 602 has a duty cycle of about 50%, with other signal characteristics, except phase, being about the same. However, a starting point (i.e., the negative edge) 604 of the signal 502 occurs at a time. A rising edge 606 of the signal 600 occurs at a time $t_3$. A rising edge 608 of the signal 602, however, occurs at time $t_3$. Thus, the signal 600 is shown to be delayed from the signal 502, and the signal 602 is shown to be delayed from the signal 600, by an amount of about 5 ns in the present exemplary embodiment. That is, the successive output signals 600 and 602 are delayed from each other and the start of the signal 502 by an amount equivalent to about a tenth of a period (i.e., about 0.5 ns) of their respective input signals. In order to produce an output signal having the delay $t_2$, a control signal is applied to the multiplexers 402 and 404 to select the input clock signals CLKOUT1*b* and CLKOUT4. Although the signals CLKOUT1*b* and CLKOUT4 are separated by about a 50% offset in their respective phases, when combined in the latch 400, they produce the output signal 600 having an output duty cycle of about 50%. However, as noticed from FIG. 6, the input signal CLKOUT1*b* and has a negative edge 610 that is delayed from the negative edge 504 of CLKOUT1 by about 0.5 ns. Similarly, the signal CLKOUT2 has a negative edge 612 that is delayed from the negative edge 610 by about 0.5 ns. Therefore, the output signals 600 and 602 are delayed from the timing of the output signal 502 by predetermined amounts of about 0.5 ns and Ins. Therefore, by carefully choosing an appropriate pair of outputs from the synchronous counter 202 and the second group of devices 206, using the multiplexers 402 and 404, output signals having various successive delays can be produced, while still maintaining a duty cycle of about 50%. The operation of the present exemplary embodiment will now be explained in greater detail.

Figure 7:
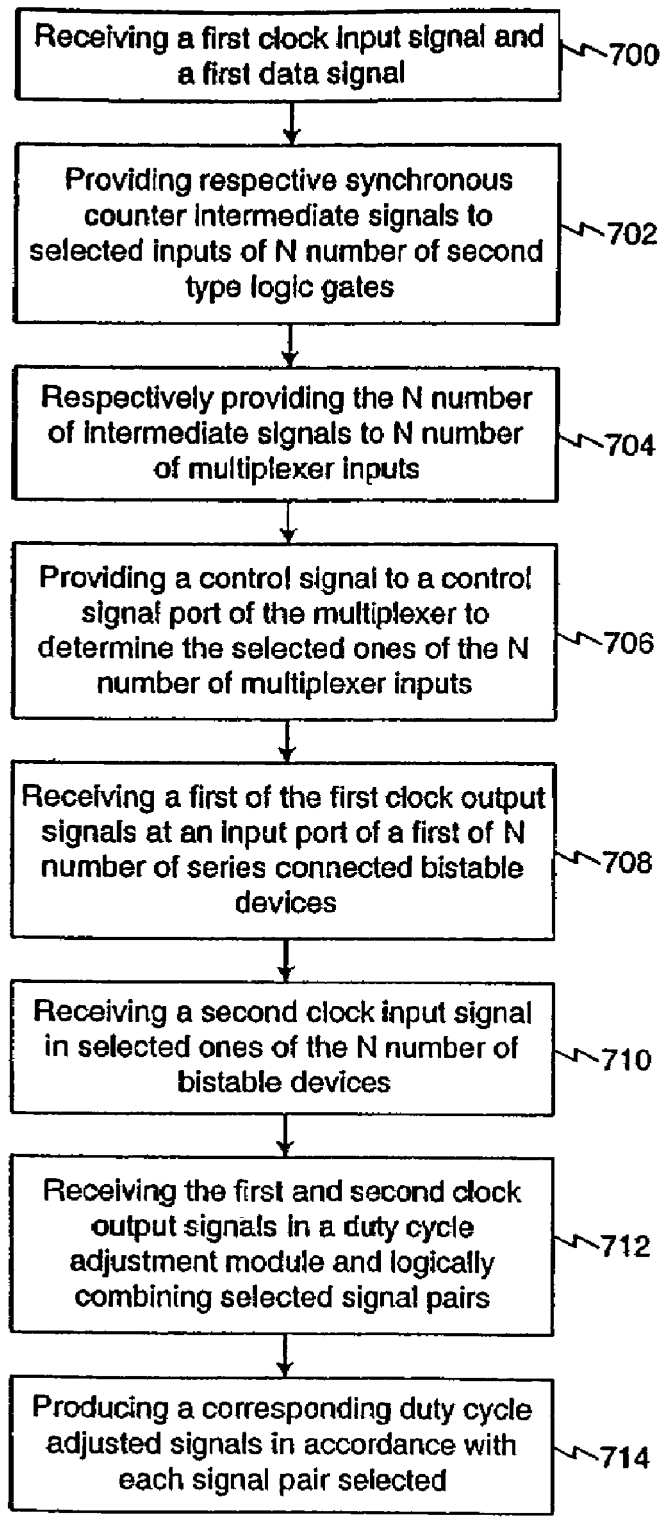
FIG. 7 depicts a method of practicing the present invention.

FIG. 7 illustrates the process of programming the exemplary circuit 100, adjusting the duty cycle of an input signal, and producing a signal having a predetermined delay. As can be seen in greater detail in FIG. 2, a first clock signal CLK is provided as an input to the input port CI of the flip-flops FFa1 through FFaN. Correspondingly, a data signal is also provided to the flip-flops FFa1 through FFaN at the data signal input port D, as depicted in block 700 of FIG. 7. Corresponding output signals are produced and provided at the live outputs LOa1–LOaN and at input ports I1 of the selected logic gates LG1–LGN, as illustrated in block 702. For purposes of illustration, the signals produced at the line outputs LOa1–LOaN are referred to as intermediate signals, and are provided to the respective input ports A–N of the multiplexer 204, as indicated in block 704 of FIG. 7. In order to determine the divide ratio of the divider circuit 102, an appropriate control signal may be provided at the control signal input port 106. Such a signal may be provided upon the setting of DIP switches or other hardware techniques, or could be implemented to occur dynamically through software. The control signal will determine which inputs are received by the multiplexer 204 and subsequently determine the divide ratio of the divider circuit 100, as indicated in block 706. The output of the multiplexer 204 is then provided as an input to the NAND gate 208 along the output path 206 and to the input port I2 of the NAND gate 208.

Next, the clock signal CLKOUT1, provided along the line output LOa1 is received at the data-input port D of the flip-flop FFb1 of the second group of devices 206. At substantially the same time, the clock signal CLKB is provided at the clock inputs CI of each of the flip-flops FFb1 through FFbN, as illustrated in block 710. In response to CLK, synchronous counter 202 produces as outputs signals CLKOUT1–CLKOUTN, shown as signal set 302 in FIG. 3. In response to the signal CLKb, the second group of devices 206 similarly outputs clock signals CLKOUT1*b*–CLKOUTnb, shown as signal set 304 in FIG. 3. Next, the signal sets 302 and 304 are provided as inputs to the duty-cycle adjustment program delay module 110, as shown in FIG. 4 and described in block 712 of FIG. 7. In accordance with a control signal applied to the control-select input port 114, an output signal, produced at the output port 116, is provided having an adjusted duty cycle and/or having a programmed delay, as described in block 714 of FIG. 7.

Therefore, using the present invention, a user is provided with the capability to program a single divider circuit to accommodate a variety of different divide ratios and adjust a duty cycle of corresponding output signals to a desired value as a function of the corresponding input signals.

Further, predetermined program delays may be programmed for successive output signals in accordance with the requirements of associated applications.

In addition, while the invention utilizes a Johnson counter, it will be understood that any suitable counter may be used to provide the respective output signals to the various stages.

From the foregoing, it will be apparent to those skilled in the art that the present invention provides a circuit for dividing the frequency of a clock signal by a non-integer. In addition, the circuit is designed for high-speed applications, and provides very low jitter division on a high-speed clock input.

While the above description contains many specific features of the invention, these should not be construed as limitations on the scope of the invention, but rather as exemplary embodiments thereof. Many other variations are possible. Accordingly, the scope of the invention should be determined not by the embodiments illustrated, but by the appended claims and their legal equivalents.

What is claimed is:

1. A method for controlling a divide ratio in a divider circuit, comprising:

synchronously counting a first clock input signal and a first data signal to produce N number of respective synchronously counted output signals, the first data signal being produced as an output of a first type logical operation;

performing N number of second type logical operations of the respective synchronously counted output signals, the synchronously counted output signals also being representative of corresponding clock output signals, each of the N number of second type logical operations forming a respective intermediate signal;

wherein one of the synchronously counted output signals forms one input to the first type logical operation and forms a first of the corresponding output signals;

multiplexing a selected number of the N number of respective intermediate signals to form a multiplexed output, the multiplexed output being provided as another input to the first type logical operation; and providing a control signal to determine the selected ones of the N number of respective intermediate signals to be multiplexed.

2. The method of claim 1, wherein the first type logical operation includes a NANDing operation and the second type logical operation includes one or more ANDing operations.

3. The method of claim 1, wherein the synchronous counting is performed in accordance with Johnson Counter operations.

* * * * *

UNITED STATES PATENT AND TRADEMARK OFFICE

CERTIFICATE OF CORRECTION

PATENT NO. : 7,005,898 B2
APPLICATION NO. : 10/946172
DATED : February 28, 2006
INVENTOR(S) : Tam et al.

It is certified that error appears in the above-identified patent and that said Letters Patent is hereby corrected as shown below:

On Title Page Item 56 col. 2, in the References Cited section, a heading for Non-Patent Documents should be inserted, listing "International Search Report issued April 22, 2002 for Appln. No. PCT/US01/31038, 8 pages.".

Signed and Sealed this

Fifth Day of September, 2006

JON W. DUDAS
*Director of the United States Patent and Trademark Office*